United States Patent
Heaton

[19]

[11] Patent Number: 5,973,561
[45] Date of Patent: Oct. 26, 1999

[54] DIFFERENTIAL CLAMP FOR AMPLIFIER CIRCUITS

[75] Inventor: Dale A. Heaton, Plano, Tex.

[73] Assignee: Texas Instruments Incorporated, Dallas, Tex.

[21] Appl. No.: 09/088,625

[22] Filed: Jun. 1, 1998

Related U.S. Application Data

[60] Provisional application No. 60/048,367, Jun. 3, 1997.

[51] Int. Cl.[6] .............................. H03F 3/45; H03K 5/08
[52] U.S. Cl. ........................................ 330/252; 327/309
[58] Field of Search ........................... 330/252; 327/309, 327/321, 327

[56] References Cited

U.S. PATENT DOCUMENTS

| | | | |
|---|---|---|---|
| 4,977,378 | 12/1990 | Tero | 330/252 |
| 5,144,171 | 9/1992 | Huard | 327/309 |
| 5,206,550 | 4/1993 | Mehta | 327/309 |

*Primary Examiner*—Robert Pascal
*Assistant Examiner*—Patricia T. Nguyen
*Attorney, Agent, or Firm*—April M. Mosby; W. James Brady; Richard L. Donaldson

[57] ABSTRACT

The frequency response of a differential amplifier or comparator is improved by adding a positive and negative clamp at the collector (drain in the case of an MOS embodiment) outputs of the differential transistor pair that will clamp the output voltage swing to less than one RC time constant. The frequency response (rise time $t_r$) is improved from $t_r = 2.2 \times RC$ to $t_r << 1 \times RC$. The differential output resistors can be increased to improve the differential gain while maintaining an improved rise time of $t_r << 1 \times RC$.

20 Claims, 2 Drawing Sheets

DIFFERENTIAL CLAMP FOR AMPLIFIER CIRCUITS

This application claims priority under 35 USC 119(e)(1) of provisional application Ser. No. 60/048,367 filed Jun. 3, 1997.

BACKGROUND OF THE INVENTION

1. Field of the Invention

This invention relates to differential amplifiers or comparator circuits.

2. Brief Description of the Prior Art

Differential amplifiers or comparators generally require high gain and high frequency response. The frequency response of a differential amplifier or comparator circuit is inversely proportional to the differential gain. As shown in FIG. 1, which is a typical basic prior art differential amplifier circuit, the differential amplifier frequency response or bandwidth is dominated by the RC time constant which is the product of the resistance of resistor R1 or R2 connected to a collector (or drain) of the differential transistor pair Q1 or Q2 and the lumped capacitance of the collector (or drain in the case of an MOS embodiment) nodes. The capacitance of the collector nodes, C, is dominated by the collector to substrate capacitance and the collector to base capacitance. The capacitance, C, is also dependent upon the semiconductor process used. Therefore, the capacitance C of the differential amplifier is fixed and cannot be reduced. The differential gain of the amplifier is proportional to the resistance of resistor R1 or R2 divided by the differential pair emitter (or source in the case of an MOS embodiment) resistance. The higher the resistance value of resistors R1 and R2, the greater the gain. Also, the lower the resistance value of resistors R1 and R2, the higher the frequency response. Therefore the performance of a differential amplifier is the result of a trade-off between frequency response and differential gain. To increase the gain of the amplifier, the resistance values of resistors R1 and R2 must be increased and to increase the frequency response, the resistance values of resistors R1 and R2 must be reduced.

Several differential amplifier stages can be cascaded to increase the gain. If there are, for example, three stages and the gain of each stage is, for example, 10, then the gain of the circuit is the product of the gain for each stage or 1000. Cascading gain stages can provide higher gains but is more susceptible to noise and increase power dissipation. Timing errors are also introduced when the differential input voltage is reduced (overdrive).

Transistors Q1 and Q2 do not completely switch, where the current supplied by transistor Q3 is shared by transistors Q1 and Q2. The voltage across the resistors R1 and R2 in the first stage does not reach full amplitude because the current is being shared by transistors Q1 and Q2. The differential voltage takes much longer to pass through the threshold because the RC effect is still present, but at a lower amplitude. The lower differential output causes the next differential pair to share current longer and switch at a slower rate as well. At these lower differential input voltages, noise can be introduced in the first two cascaded stages. Inductance of the package leads for power, ground and input leads can introduce noise on the die. Noise can be introduced by power and ground ringing, noisy substrate coupling to the signal paths or crosstalk between signals, causing positive and/or negative parasitic feedback. Positive feedback can cause frequency dependent timing errors and negative feedback can cause low level oscillations. Higher gain in the first stage will reduce these noise related errors.

Both high gain and high frequency response of differential comparator circuits is required for analog to digital conversions. This includes high speed comparators for logic threshold conversions, digital input and output buffers, flash converters and successive approximation analog to digital converters.

A circuit which has been used to improve frequency response involves the addition to the differential amplifier of FIG. 1 of schottky diodes (D1, D2) with a series resistor R4 across the differential output resistors R1 and R2 as shown in FIG. 2. The series resistor R4 is chosen to be ½ of R1 or R2 such that the high and low state is centered around the threshold voltage. The diodes D1, D2 are 0 volts biased at the threshold of the amplifier such that the gain is not reduced by the added circuit. However, the schottky diodes D1, D2, become forward biased through the series resistor R4 once the differential output has crossed through the threshold. With the diodes D1, D2 forward biased, the RC resistance is reduced to R1 in parallel with the series resistor R4+resistor R2 or 0.6×R1. The reduced R improves the rise time to 2.2×(0.6×R)×C or 1.32 RC. This is a significant improvement, but the capacitance, C, is assumed to be constant. Actually, the addition of the diodes adds a significant amount of capacitance (about 25% or more). Therefore, the rise time is $T_r=1.32 \times RC \times (1.25)$ or 1.65×RC. This is still a significant improvement over 2.2×RC.

It is the goal to further improve one or both of the frequency response and the gain of a differential amplifier without affecting the other or by affecting the other to a lesser extent than in the prior art, thereby diminishing or eliminating the trade-off.

SUMMARY OF THE INVENTION

In accordance with the present invention, the frequency response of a differential amplifier or comparator is improved over the schottky diodes and series resistor circuit described above with reference to FIGS. 1 and 2 by adding a positive and negative clamp at the collector (drain in the case of an MOS embodiment) outputs of the differential transistor pair that will clamp the output voltage swing to less than one RC time constant. The frequency response (rise time $t_r$) is improved from $t_r=2.2 \times RC$ to $t_r<<1 \times RC$. The differential output resistors can now be increased to improve the differential gain while maintaining an improved rise time of $t_r<<1 \times RC$.

DESCRIPTION OF THE PREFERRED EMBODIMENTS

Figure 1:
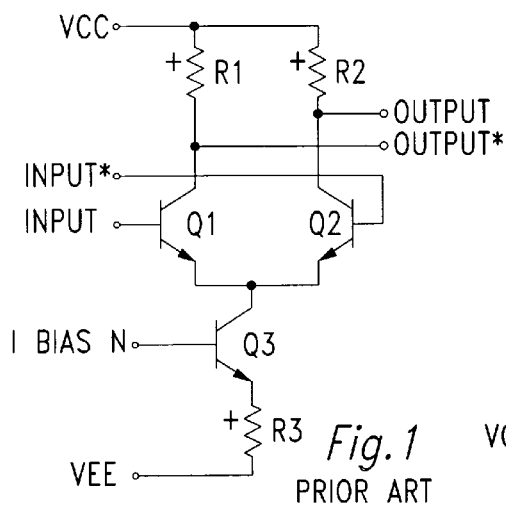
FIG. 1 is a circuit diagram of a typical prior art differential amplifier circuit.
Figure 2:
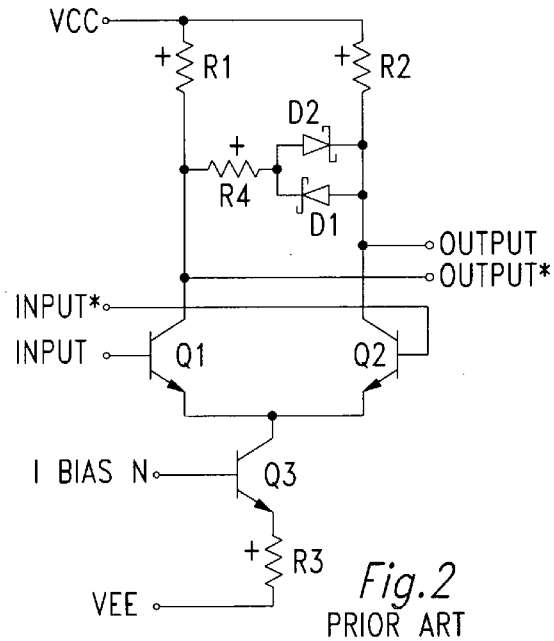
FIG. 2 is a circuit diagram of an improved differential amplifier circuit in accordance with the prior art.
Figure 3:
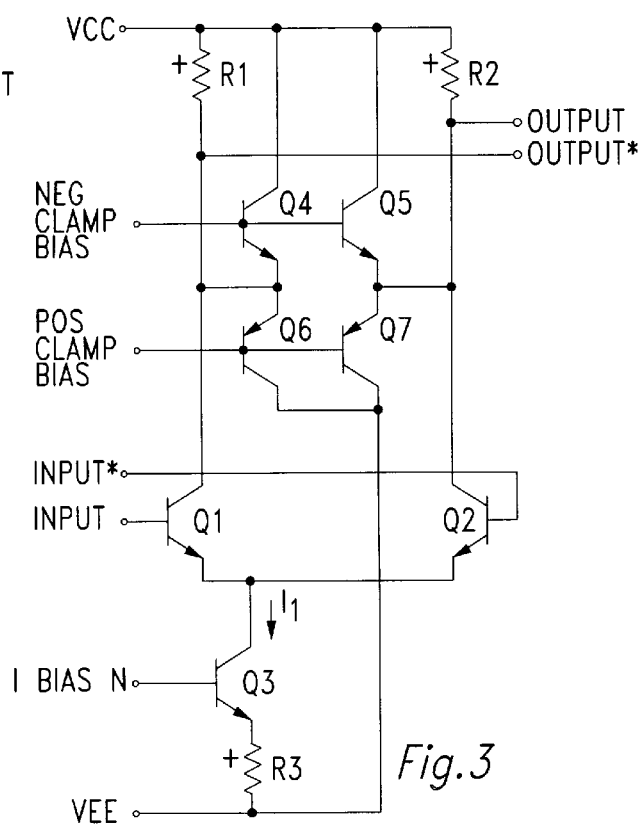
FIG. 3 is a circuit diagram of a differential amplifier with a differential clamp in accordance with the present invention.

Referring now to FIG. 3, there is shown a differential amplifier with the differential clamp in accordance with the present invention wherein like references refer to the same structure as set forth in FIGS. 1 and 2. The differential clamp circuit of the present invention improves the frequency response and increases the differential gain of a differential comparator stage. This is accomplished by clamping the differential output voltage to much less than one RC time constant, thus allowing larger differential resistor values for high gain. The inputs to the clamped differential comparator circuit, INPUT and INPUT*, are connected to the base of transistors Q1 and Q2 respectively. Transistors Q1 and Q2 are the differential input transistors and transistor Q3 and resistor R3 provide the bias current to the differential input transistors Q1 and Q2. The base of transistor Q3 with signal IBIASN controls the bias current I1. Resistors R1 and R2 are the differential output resistors connected to the collectors of transistors Q1 and Q2 respectively. Transistors Q4 and Q5, which are coupled between $V_{cc}$ and outputs OUTPUT and OUTPUT* respectively, provide the negative clamp on the output swing, where the signal NEGCLAMPBIAS controls the negative clamp voltage. Transistors Q6 and Q7, which are coupled between $V_{EE}$ and outputs OUTPUT and OUTPUT* respectively, provide the positive clamp on the output swing, where the signal POSCLAMPBIAS controls the positive clamp voltage. The base-emitter junctions of the PNP transistors Q6 and Q7 and NPN transistor Q4 and Q5 provide a very low resistance clamp with the very low capacitance of the emitter junction. The OUTPUT and OUTPUT* lines are the differential comparator outputs that are connected to the next stage or emitter follower output transistors to isolate the output from external loading or from the loading of the next stage. For the example of the preferred embodiment, the value of resistor R3 is chosen to be ¼ the value of resistor R1. Resistors R1 and R2 are equal in value. The IBIASN signal is chosen such that the typical voltage across resistor R3 is 0.6 volts. With the inputs INPUT and INPUT* biased such that all of the current is flowing through transistors Q1 and Q2 and, without the transistor clamps Q4 to Q7, the voltage across resistors R1 or R2 would be 0.6×(R1/R3)=2.4 volts. The NEGCLAMPBIAS and POSCLAMPBIAS signals are chosen relative to the IBIASN signal such that the output threshold is centered around the output clamp voltages.

For the above described example, the NEGCLAMPBIAS and POSCLAMPBIAS signals are chosen such that the differential output swing is clamped +/−0.6 volts. This is ¼ of the total swing. The differential voltage of 2.4 volts is clamped at 0.9 volt and 1.5 volts. This clamped voltage is 0.375 and 0.625 of the total voltage swing. Referring to an RC time constant table, this is approximately 0.5 RC time constants. Rise time using the 10% to 90% measurement point relates to approximately $t_r=0.4 \times RC$ time constants. Therefore, for a given gain, which is proportional to resistor R1 divided by the emitter resistance, the frequency response can be improved from 2.2×RC to 0.4×RC by clamping the output swing to ¼ of the total output swing. This is a substantial improvement, however the capacitance C is not the same for the common differential comparator stage vs. the differential clamped comparator stage. Actually, the addition of the emitter capacitance of the transistor clamps will add some capacitance (about 10% more capacitance). Therefore, the rise time is $t_r=0.4 \times R \times (1.10C)$ or $t_r 0.44$ RC. This is a significant improvement over $t_r=2.2 \times RC$. This is a bandwidth, frequency response and rise time improvement of 2.2/0.44=5 times.

Figure 4:
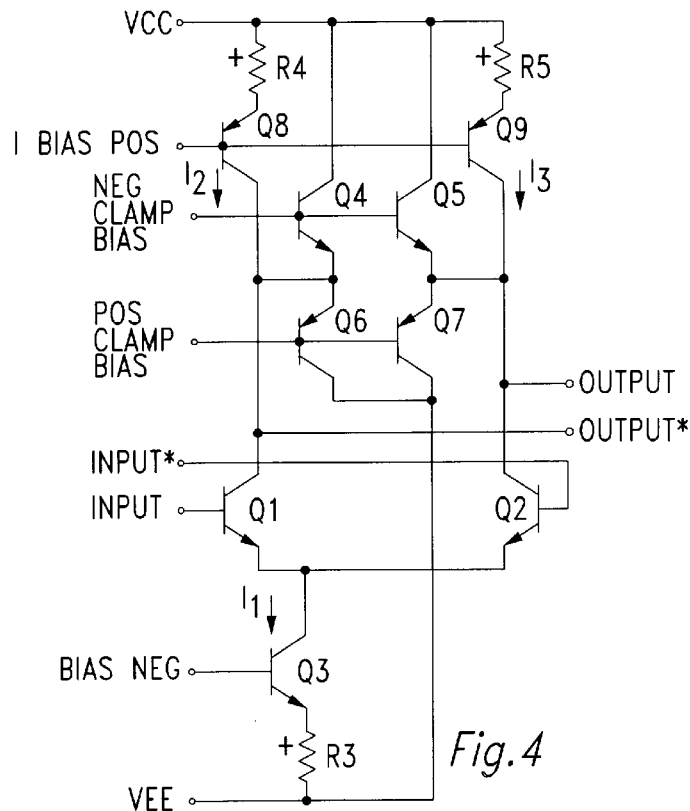
FIG. 4 is a circuit diagram of a differential amplifier as set forth in FIG. 3 having positive current sources.
Figure 5:
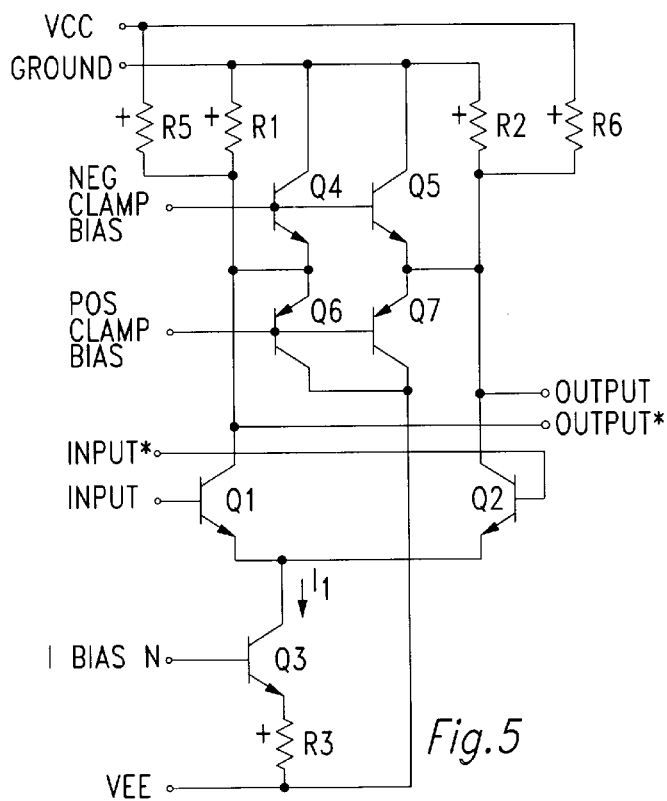
FIG. 5 is a circuit diagram of a differential amplifier as set forth in FIG. 3 with Thevenin output resistors.

Other variations of the circuit of FIG. 3 described in detail hereinbelow include a first circuit which replaces the pull up resistors with positive current sources as shown in FIG. 4 and an improved ECL output stage including the emitter follower outputs with ground as the upper reference and Thevenin equivalent resistor network providing the positive current that is to be clamped at ground as shown in FIG. 5.

Referring to FIG. 4, the positive current sources provide a much higher differential gain. Controlled by the IBIASPOS signal, transistor Q8 and resistor R4 create current I2 and transistor Q9 and resistor R5 create current I3. Current I2 is equal to current I3. Signals IBIASNEG and IBIASPOS are chosen such that I2 is one half of I1. By controlling IBIASNEG and IBIASPOS proportionally, the delay through the differential stage can be controlled by the equation t=0.5E×(C/I). The voltage swing (E) is fixed by the clamp voltage, I is equivalent to the current I2 controlled by IBIASPOS and C is the nodal capacitance of the outputs OUTPUT and OUTPUT*. For a negative voltage swing, t=0.5E×(C/(I1−I2)=0.5E×(C/I2). For a positive voltage swing, t=0.5E×(C/I2). By externally controlling the bias currents I2, I3 and I1, a programmable delay is achieved.

Referring to FIG. 5, the rise time of this ECL output stage is improved by adding the differential clamp as described above. The ECL output is referenced to ground. Resistors R4 and R5 are connected to a positive voltage source $V_{cc}$ to provide a Thevenin equivalent circuit. The Thevenin equivalent circuit is the parallel resistance of resistors R2 and R4 connected to a voltage source slightly more positive than ground. Also, resistors R2 and R5 provide a complementary Thevenin equivalent circuit. The use of the Thevenin equivalent circuit still allows the circuit to be referenced to ground.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A differential amplifier which comprises:

first and second differential transistors, each with a series resistance, connected in parallel across a source of power, said source of power has a relatively positive terminal and a relatively negative terminal;

first and second output terminals, each said output terminal coupled to a different one of said differential transistors; and a clamp circuit coupled to said source of power and each of said output terminals to clamp the outputs from said first and second output terminals within a predetermined range, said clamp circuit includes first and second relatively negative clamping transistors coupled between said relatively positive terminal and a different one of the said output terminals and third and fourth relatively positive clamping transistors coupled between said relatively negative terminal and a different one of said output terminals.

2. The amplifier of claim 1 wherein said first and second relatively negative clamping transistors are NPN transistors and said third and fourth relatively positive clamping transistors are PNP transistors.

3. The amplifier of claim 2 wherein said first and third clamping transistors are connected in series with the junction thereof coupled to said first output terminal and said second and fourth clamping transistors are connected in series with the junction thereof coupled to said second output terminal.

4. The amplifier of claim 1 wherein said clamp circuit clamps the voltage across said first and second output terminals to a rise time (tr) less than 2.2 * RC where R is said series resistance and C is substantially the nodal capacitance at said first or second output terminal.

5. The amplifier of claim 2 wherein said clamp circuit clamps the voltage across said first and second output terminals to a rise time (tr) less than 2.2 * RC where R is said series resistance and C is substantially the nodal capacitance at said first or second output terminal.

6. The amplifier of claim 3 wherein said clamp circuit clamps the voltage across said first and second output terminals to a rise time (tr) less than 2.2 * RC where R is said series resistance and C is substantially the nodal capacitance at said first or second output terminal.

7. A differential amplifier which comprises:
   (a) first and second differential transistors, each with a series resistance, connected in parallel across a source of power;
   (b) first and second output terminals, each said output terminal coupled to a different one of said differential transistors;
   (c) a positive clamp coupled to said first and second output terminals; and
   (d) a negative clamp coupled to said first and second output terminals to clamp the outputs from said first and second output terminals within a predetermined range.

8. The amplifier of claim 7 wherein said source of power has a relatively positive terminal and a relatively negative terminal and said negative clamp includes first and second transistors, each coupled between said relatively positive terminal and a different one of said output terminals and third and fourth transistors coupled between said relatively negative terminal and a different one of said output terminals.

9. The amplifier of claim 8 wherein said first and second transistors are NPN transistors and said third and fourth transistors are PNP transistors.

10. The amplifier of claim 9 wherein said first and third transistors are connected in series with the junction thereof coupled to said first output terminal and said second and fourth transistors are connected in series with the junction thereof coupled to said second output terminal.

11. The amplifier of claim 7 wherein said clamp circuit clamps the voltage across said first and second output terminals to a rise time (tr) less than 2.2 * RC where R is said series resistance and C is substantially the nodal capacitance at said first or second output terminal.

12. The amplifier of claim 8 wherein said clamp circuit clamps the voltage across said first and second output terminals to a rise time (tr) less than 2.2 * RC where R is said series resistance and C is substantially the nodal capacitance at said first or second output terminal.

13. The amplifier of claim 9 wherein said clamp circuit clamps the voltage across said first and second output terminals to a rise time (tr) less than 2.2 * RC where R is said series resistance and C is substantially the nodal capacitance at said first or second output terminal.

14. The amplifier of claim 10 wherein said clamp circuit clamps the voltage across said first and second output terminals to a rise time (tr) less than 2.2 * RC where R is said series resistance and C is substantially the nodal capacitance at said first or second output terminal.

15. A differential amplifier which comprises:
    (a) first and second differential transistors, each with a current source, connected in parallel across a source of power;
    (b) first and second output terminals, each said output terminal coupled to a different one of said differential transistors;
    (c) a positive clamp coupled to said first and second output terminals; and
    (d) a negative clamp coupled to said first and second output terminals to clamp the outputs from said first and second output terminals within a predetermined range.

16. The amplifier of claim 15 wherein said source of power has a relatively positive terminal and a relatively negative terminal and said negative clamp includes first and second transistors, each coupled between said relatively positive terminal and a different one of said output terminals and third and fourth transistors coupled between said relatively negative terminal and a different one of said output terminals.

17. The amplifier of claim 16 wherein said first and second transistors are NPN transistors and said third and fourth transistors are PNP transistors.

18. The amplifier of claim 17 wherein said first and third transistors are connected in series with the junction thereof coupled to said first output terminal and said second and fourth transistors are connected in series with the junction thereof coupled to said second output terminal.

19. The amplifier of claim 15 wherein said clamp circuit clamps the voltage across said first and second output terminals to reduce the rise time (tr) of the said current source (I) and nodal capacitance (C) at said first or second output terminal by reducing the voltage swing (E), where tr=E*(C/I).

20. The amplifier of claim 16 wherein said clamp circuit clamps the voltage across said first and second output terminals to reduce the rise time (tr) of the said current source (I) and nodal capacitance (C) at said first or second output terminal by reducing the voltage swing (E), where tr=E*(C/I).

* * * * *